United States Patent
Yang (10) Patent No.: US 8,729,886 B2
(45) Date of Patent: May 20, 2014

(54) DEVICE FOR MEASURING ALTERNATING CURRENT MAGNETIC SUSCEPTIBILITY AND METHOD OF MEASURING THE SAME

(75) Inventor: Shieh-Yueh Yang, Taipei (TW)

(73) Assignee: Magqu Co., Ltd., Taipei (TW)

( * ) Notice: Subject to any disclaimer, the term of this patent is extended or adjusted under 35 U.S.C. 154(b) by 350 days.

(21) Appl. No.: 12/852,330

(22) Filed: Aug. 6, 2010

(65) Prior Publication Data

US 2011/0140688 A1 Jun. 16, 2011

(51) Int. Cl.
*G01N 27/74* (2006.01)

(52) U.S. Cl.
USPC .......................................... 324/204; 324/340

(58) Field of Classification Search
USPC ........................................ 324/201, 204, 340
See application file for complete search history.

(56) References Cited

U.S. PATENT DOCUMENTS

| | | | |
|---|---|---|---|
| 5,311,125 A * | 5/1994 | Krause et al. | 324/201 |
| 5,408,178 A * | 4/1995 | Wikswo et al. | 324/201 |
| 6,477,398 B1 * | 11/2002 | Mills | 600/409 |
| 6,683,452 B2 | 1/2004 | Lee et al. | 324/240 |
| 6,825,655 B2 | 11/2004 | Minchole et al. | 324/204 |
| 7,541,805 B2 | 6/2009 | Mito et al. | 324/248 |
| 8,275,427 B2 * | 9/2012 | Kim et al. | 505/160 |
| 2009/0102458 A1 | 4/2009 | Ledieu et al. | 324/201 |
| 2009/0102473 A1 * | 4/2009 | Narishige et al. | 324/240 |

* cited by examiner

*Primary Examiner* — Arleen M Vazquez
*Assistant Examiner* — Alesa Allgood
(74) *Attorney, Agent, or Firm* — Hogan Lovells US LLP (57) ABSTRACT

A device for measuring alternating current (AC) magnetic susceptibility and the method for measuring the same are provided. The device comprises an AC magnetic susceptibility coil set, a signal capturing unit, and a signal processing unit. The device detects AC magnetic susceptibility signals from under testing particles in the magnetic field with variable AC frequencies, and extracts the AC magnetic susceptibility intensity variation and phase difference and/or the real part and the imaginary part of the AC magnetic susceptibility by the signal processing unit.

11 Claims, 12 Drawing Sheets

DEVICE FOR MEASURING ALTERNATING CURRENT MAGNETIC SUSCEPTIBILITY AND METHOD OF MEASURING THE SAME

BACKGROUND OF THE INVENTION

1. Field of the Invention

The present invention generally relates to a device and method for measuring alternating current magnetic susceptibility, more particularly to a device and method for measuring the alternating current magnetic susceptibility intensity variation and phase difference and/or the real part and the imaginary part of the alternating current magnetic susceptibility.

2. Description of the Prior Art

Within an external added field, the magnetic dipole moment direction of a magnetic particle is led to be along the direction of the external added field based on the magnetization effect. As the external added field is an AC (alternating current) magnet field with AC frequency not too high enough such as the low frequency area of a microwave frequency, the magnetic dipole moment direction is periodically oscillating there and back following the AC magnet field. At this moment, the oscillation frequency of the magnetic dipole moment is the same to the frequency of the external added field. However, the actual magnetic field direction does not match the expected magnetic field direction due to the instant magnetic dipole moment direction is uncertainly the same to the external added field direction. The periodically oscillating phase difference is so-called a magnetic field phase difference. Therefore, AC magnetic susceptibility of a magnetic particle within an AC magnetic field is able to be represented by the magnetic susceptibility intensity and the phase difference of the magnetic particle.

U.S. Pat. No. 6,683,452 provides a device for detecting magnetic characteristics. The device is used for detecting an internal crack of a metal or a shape of the metal, which comprises magnetic field generating unit, magnetic flux density measurement unit, a magnetic flux focusing unit and a display unit. The display unit further includes a synchronic portion, an amplification portion, a conversion portion and a display portion and used for real-time displaying changes in the magnetic flux density by analyzing the signals from the magnetic field generating unit and the magnetic flux focusing unit. However, the device is only suitable for detecting the magnetic flux but not suitable for detecting the AC magnetic susceptibility and the phase difference of the magnetic field.

U.S. Pub. NO. 20090102458 provides a device for measuring magnetic susceptibility. Although the device is able to measure the magnetic susceptibility of a magnetic particle when the magnetic particle is within a magnetic field and interacting with the magnetic field, but the device can not measure the phase difference of the magnetic field and the real part and the imaginary part of the AC magnetic susceptibility. Comparing with the device described in U.S. Pub. NO. 20090102458, the device of the present invention can not only measure the magnetic susceptibility intensity and phase difference of under testing particles, but also extract the real part and the imaginary part of the AC magnetic susceptibility and the changes of the AC magnetic susceptibility of the under testing particles in various frequencies.

U.S. Pat. No. 7,541,805 provides a system with superconducting quantum interference device for measuring magnetic characteristics. The superconducting quantum interference device detects the magnetic flux variation of a pickup coil and outputs an AC signal when under testing particles are disposed within an AC magnetic field. The AC signal includes a real part signal and an imaginary part signal. The real part signal and the imaginary part signal may be separated inaccuracy when the AC signal does not equal to a reference signal. Therefore, a phase regulation for the measuring result is needed for reducing the inaccuracy. The AC signal of the system includes a real part signal and an imaginary part signal for determining if the phase regulation needed to be executed for reducing the phase difference and making the measuring result more accurate. However, the system can not detect the changes of magnetic susceptibility intensity and phase difference in various frequencies and extract the real part and the imaginary part of the AC magnetic susceptibility. Moreover, the system with superconducting quantum interference device described in U.S. Pat. No. 7,541,805 is suitable for precision instrument department due to its high-priced and tightly operation conditions. For industrial circles without precision instrument department or basic purposes in general academic circles speaking, the system is unsuitable. Comparing with the system with superconducting quantum interference device described in U.S. Pat. No. 7,541,805, the device of the present invention can not only measure the magnetic susceptibility intensity and phase difference of under testing particles, but also extract the real part and the imaginary part of the AC magnetic susceptibility and the changes of the AC magnetic susceptibility of the under testing particles in various frequencies.

U.S. Pat. No. 6,825,655 provides a method for detecting changes of magnetic response of at least one magnetic particle provided with an external layer in a carrier fluid. The method comprising measuring the characteristic rotation time of the magnetic particle with respect to the external layer, and measuring Brownian relaxation in the carrier fluid under the influence of an external alternating magnetic field. The method implies that upon modification of the effective volume of the particle or its interaction with the carrier fluid, a hydrodynamic volume of the particle changes, which implies a change of the frequency ($f_{max}$) at which an out of phase component of the magnetic susceptibility has its maximum. However, problems with this technique are that it is not sensitive as compared with other presently available sensors and high-priced.

The present invention utilizes an AC magnetic susceptibility coil set with simply construction for overcoming the problems (can not measure the phase difference of the magnetic field, the real part and the imaginary part of the AC magnetic susceptibility and the changes of the AC magnetic susceptibility of the under testing particles in various frequencies) aforementioned in U.S. Pat. No. 6,683,452 and U.S. Pub. NO. 20090102458. Moreover, the present invention also overcomes the problems of high-priced, tightly operation conditions, only suitable for precision instrument department and not sensitive aforementioned in U.S. Pat. Nos. 7,541,805 and 6,825,655.

SUMMARY OF THE INVENTION

An objective of the present invention is to provide a device for measuring alternating current (AC) magnetic susceptibility for measuring AC magnetic susceptibility intensity variation or phase difference of under testing particles within an AC magnetic field.

Another objective of the present invention is to provide a device for measuring alternating current (AC) magnetic susceptibility for measuring AC magnetic susceptibility intensity variation or phase difference of under testing particles within an AC magnetic field.

Another yet objective of the present invention is to provide a device with an AC magnetic susceptibility coil set measuring AC magnetic susceptibility intensity variation or phase difference of under testing particles within an AC magnetic field.

For achieving above objectives, the present invention provides a device for measuring alternating current magnetic susceptibility, comprising: a function generator for generating alternating current electrical signals; an alternating current magnetic susceptibility coil set, including: an exciting coil coupled to the function generator for generating an alternating current magnetic field based on variation of the alternating current electrical signals form the function generator; and a pickup coil for picking up an alternating current magnetic susceptibility signal of an under testing particle generated by inducting the variation of the alternating current magnetic field of the exciting coil; a signal capturing unit for capturing the alternating current magnetic susceptibility signal picked up by the pickup coil; and a signal processing unit for processing the alternating current magnetic susceptibility signal from the signal capturing unit and extracting the alternating current magnetic susceptibility intensity variation and phase difference and/or the real part and the imaginary part of the AC magnetic susceptibility.

In one embodiment of the present invention, the function generator is any one of conventional function generators, such as a SFG-1000 series function generator developed by Good Will Instrument Co., Ltd. or a SRS-DS335 series function generator developed by Stanford Research Systems, Inc., etc.

In one embodiment of the present invention, the exciting coil is any one of suited ready made coils, such as a Helmholtz coil or a self-made exciting coil as a solenoid coil, etc. The self-made exciting coil is made of any conventional suited materials. For example, the self-made exciting coil is finished by processing polyoxymethylene (POM) material at first and then surrounding the polyoxymethylene (POM) material with copper wires.

In one embodiment of the present invention, the exciting coil of the alternating current magnetic susceptibility coil set and the function generator are electrically connected for generating an alternating current magnetic field on the exciting coil.

In one embodiment of the present invention, the pickup coil is a self-made pickup coil or any one of conventional pickup coils such as gradient coils or Faraday coils. Moreover, the pickup coil is disposed on any position for generating the induction corresponding to position of the exciting coil. For example, the pickup coil is disposed on center of the exciting coil and coaxially with the exciting coil.

In one embodiment of the present invention, the signal capturing unit is any one of conventional signal capturing units, such as a NI PCI-6221 series signal capturing unit developed by National Instruments. The signal capturing unit is a software, a firmware or a hardware processing unit. The software processing unit or the firmware processing unit is better in use. Moreover, the signal capturing unit includes fast Fourier transform program for improving the processing ability on time domain signals and spectrum signals.

In one embodiment of the present invention, the device for measuring alternating current magnetic susceptibility further comprises a signal amplification circuit. Thus, output signal of the pickup coil is amplified through the signal amplification circuit and then captured by the signal capturing unit for improving small signals capture sensitivity. Finally, the alternating current magnetic susceptibility signal is converted to a spectrum signal through the signal processing unit. The signal amplification circuit is any one of conventional signal amplification circuits, better with an adjustable amplification ratio function. Moreover, the signal amplification circuit and the signal capturing unit are combined to be a single circuit.

In one embodiment of the present invention, the measuring result of the device for measuring alternating current magnetic susceptibility is stored in a memory, storage or displayed on a monitor directly. Thus, the device for measuring alternating current magnetic susceptibility further comprises a display unit for displaying the measuring result and/or a storage unit for storing the measuring result. Certainly, the measuring result of the device for measuring alternating current magnetic susceptibility is able to be also stored in an external storage or displayed on an external monitor. Moreover, the device for measuring alternating current magnetic susceptibility further comprises a voltage dividing cancellation circuit coupled to the alternating current magnetic susceptibility coil set, wherein the voltage dividing cancellation circuit is connected to the pickup coil of the alternating current magnetic susceptibility coil set for cancelling the affection of the output signal of the pickup coil induced by the alternating current magnetic field generated from the exciting coil. The output signal is captured by the signal capturing unit. Finally, a spectrum signal converted from the alternating current magnetic susceptibility signal through the signal processing unit is outputted.

Furthermore, for matching up the use in general electrical engineering, electronics, physics and material laboratories with function generators, another embodiment of the device for measuring alternating current magnetic susceptibility of the present invention is able to connect to an external function generator, comprising: an alternating current magnetic susceptibility coil set, including: an exciting coil coupled to the external function generator for generating an alternating current magnetic field based on alternating current electrical signals of the external function generator; and a pickup coil for picking up an alternating current magnetic susceptibility signal of an under testing particle generated by inducting the variation of the alternating current magnetic field of the exciting coil; a signal capturing unit for capturing the alternating current magnetic susceptibility signal picked up by the pickup coil; and a signal processing unit for processing the alternating current magnetic susceptibility signal from the signal capturing unit and extracting the alternating current magnetic susceptibility intensity variation and phase difference and/or the real part and the imaginary part of the AC magnetic susceptibility.

The exciting coil, the pickup coil, the signal capturing unit and the signal processing unit are the same to aforementioned, so do their connecting relationship. The device for measuring alternating current magnetic susceptibility with an external function generator is the same to aforementioned, further comprising a signal amplification circuit and/or a voltage dividing cancellation circuit with the same functions and connecting relationship to aforementioned.

In another yet embodiment, a method for measuring alternating current magnetic susceptibility is provided. The method comprises: an alternating current magnetic susceptibility measuring step for measuring alternating current magnetic susceptibility signals of an under testing particle and a control, respectively; a first signal converting step for converting the alternating current magnetic susceptibility signals of the under testing particle and the control to spectrum signals of the under testing particle and the control, respectively; a second signal converting step for converting the spectrum signals of the under testing particle and the control to time domain signals of the under testing particle and the control, respectively; a subtraction operation step for extracting a difference time domain signal of the under testing particle by subtracting the time domain signal of the control from the time domain signal of the under testing particle; a difference converting step for converting the difference time domain signal of the under testing particle to a difference spectrum signal of the under testing particle; and a time domain signal output . step for outputting the difference time domain signal; wherein the alternating current magnetic susceptibility measuring step, the first signal converting step and the second signal converting step are executed sequentially or non-sequentially.

Generally speaking, the control is air or a particular control such as particular air based on the demand. In the alternating current magnetic susceptibility measuring step, the order of measuring the alternating current magnetic susceptibility signals of the under testing particle and the control is unrestricted. In the first signal converting step, the order of converting the alternating current magnetic susceptibility signals of the under testing particle and the control to the spectrum signals of the under testing particle and the control is unrestricted. In the second signal converting step, the order of converting the spectrum signals of the under testing particle and the control to the time domain signals of the under testing particle and the control is unrestricted.

The description, "the alternating current magnetic susceptibility measuring step, the first signal converting step and the second signal converting step are executed sequentially", aforementioned means that after the alternating current magnetic susceptibility measuring step is finished, then the first signal converting step is executed, and after the first signal converting step is finished, then the second signal converting step is executed. The description, "the alternating current magnetic susceptibility measuring step, the first signal converting step and the second signal converting step are executed non-sequentially", aforementioned, for the alternating current magnetic susceptibility measuring step and the first signal converting step speaking, means that after a part of the alternating current magnetic susceptibility measuring step is executed, a part of the first signal converting step is then executed. For example, after measuring the alternating current magnetic susceptibility of the under testing particle, the alternating current magnetic susceptibility of the under testing particle is then converted to the spectrum signal of the under testing particle, and then converting the alternating current magnetic susceptibility of the control to the spectrum signal of the control after measuring the alternating current magnetic susceptibility of the control. Besides, the order of the under testing-particle and the control is swappable. It means that after measuring the alternating current magnetic susceptibility of the control, the alternating current magnetic susceptibility of the control is then converted to the spectrum signal of the control, and then converting the alternating current magnetic susceptibility of the under testing particle to the spectrum signal of the under testing particle after measuring the alternating current magnetic susceptibility of the under testing particle.

In the same way, the description, "the first signal converting step and the second signal converting step are executed non-sequentially", aforementioned means that after a part of first signal converting step is executed, a part of the second signal converting step is then executed. For example, after converting the alternating current magnetic susceptibility of the under testing particle to the spectrum signal of the under testing particle, the spectrum signal of the under testing particle is then converted to the time domain signal of the under testing particle, and then converting the spectrum signal of the control to the time domain of the control after converting the alternating current magnetic susceptibility of the control to the spectrum signal of the control. Besides, the order of the under testing particle and the control is swappable. It means that after converting the alternating current magnetic susceptibility of the control to the spectrum signal of the control, the spectrum signal of the control is then converted to the time domain signal of the control, and then converting the spectrum signal of the under testing particle to the time domain signal of the under testing particle after converting the alternating current magnetic susceptibility of the under testing particle to the spectrum signal of the under testing particle.

Persons skilled in the art can derive from the present invention easily that the first signal converting step and the second signal converting step are executed in parallel, such as "dual core technology" for executing the first signal converting step and the second signal converting step of the under testing particle by one core and executing the first signal converting step and the second signal converting step of the control by another core.

The description, "the alternating current magnetic susceptibility measuring step, the first signal converting step and the second signal converting step are executed sequentially or non-sequentially", aforementioned means that the execution order of the three steps is completely executing sequentially, completely executing non-sequentially, or partially executing sequentially and partially executing non-sequentially. The completely executing non-sequentially is a better mode.

Figure 9:
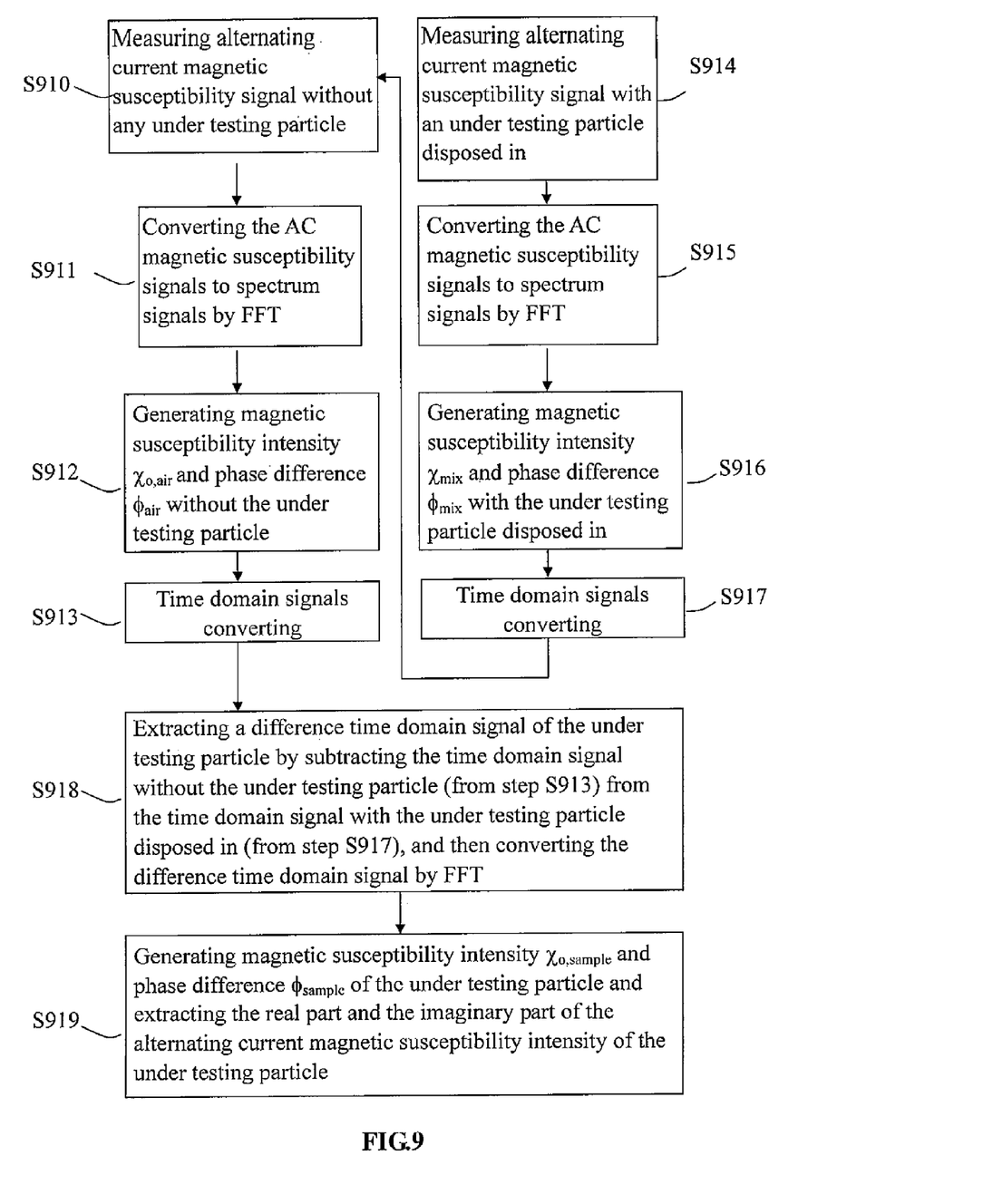
FIG. 9 is a flow chart illustrating another yet embodiment of a method for measuring alternating current magnetic susceptibility of the present invention.
Figure 10:
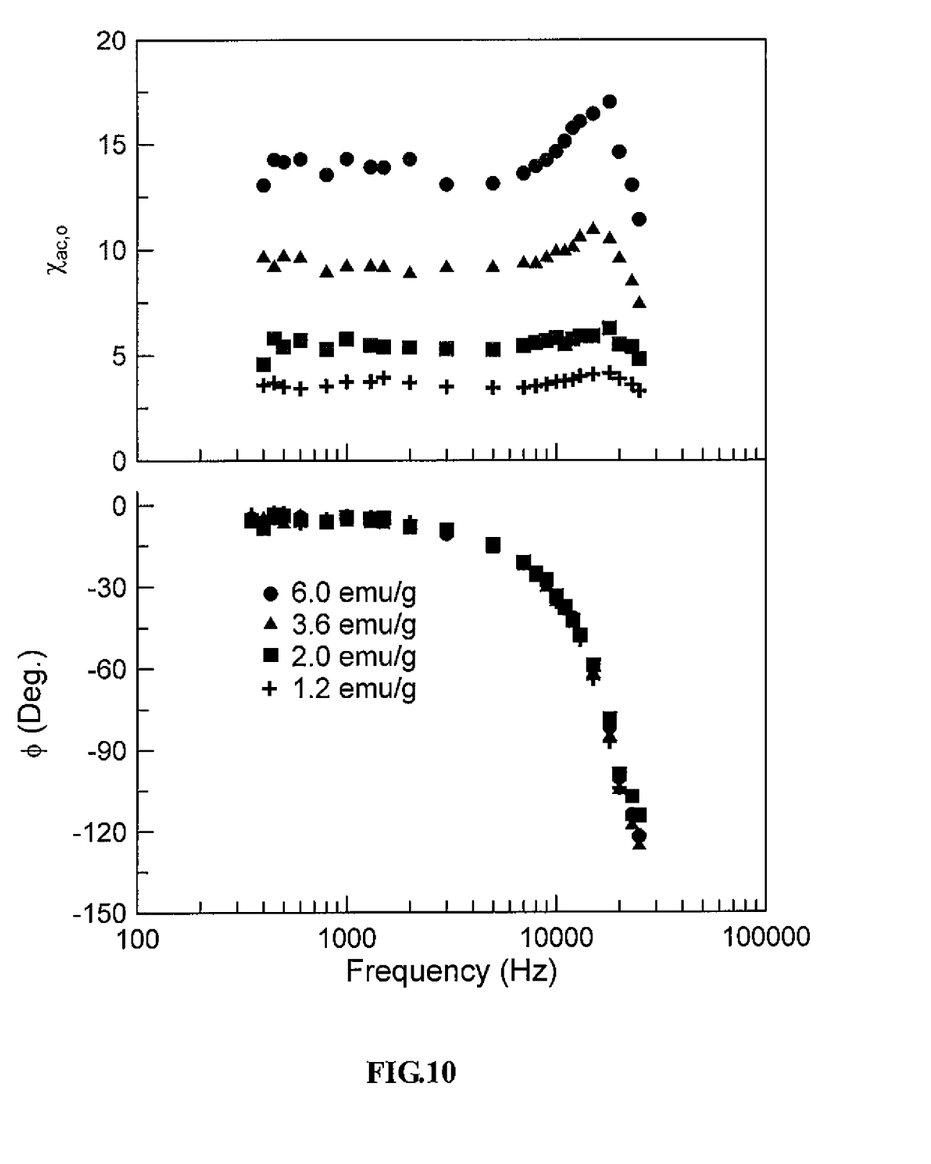
FIG. 10 is a relationship diagram of measuring the alternating current magnetic susceptibility intensity and phase difference of magnetic fluids with different concentration following frequency variation of an external added field according to one embodiment of the present invention.

Referring to FIG. 9 and the corresponding description, the "completely executing non-sequentially" means that after the alternating current magnetic susceptibility measuring step, the first signal converting step and the second signal converting step of the under testing particle are executed, the alternating current magnetic susceptibility measuring step, the first signal converting step and the second signal converting step of the control are then executed. Referring to FIG. 10 and the corresponding description, the "completely executing non-sequentially" means that after the alternating current magnetic susceptibility measuring step, the first signal converting step and the second signal converting step of the control are executed, the alternating current magnetic susceptibility measuring step, the first signal converting step and the second signal converting step of the under testing particle are then executed.

The "partially executing non-sequentially" means that executing the first signal converting step and the second signal converting step non-sequentially after the alternating current magnetic susceptibility measuring step is executed, or executing the second signal converting step after the alternating current magnetic susceptibility measuring step and the first signal converting step are executed.

According the method for measuring alternating current magnetic susceptibility of the present invention, after the alternating current magnetic susceptibility measuring step, the first signal converting step and the first signal converting step are executed sequentially or non-sequentially, the difference time domain signal of the under testing particle is extracted by subtracting the time domain signal of the control from the time domain signal of the under testing particle, and the difference spectrum signal of the under testing particle is then outputted after the time domain signal of the under testing particle converted to the difference spectrum signal of the under testing particle.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits, and advantages of the preferred embodiments of the present invention will be readily understood by the accompanying drawings and detailed descriptions, wherein.

DETAILED DESCRIPTION OF THE INVENTION

Figure 1:
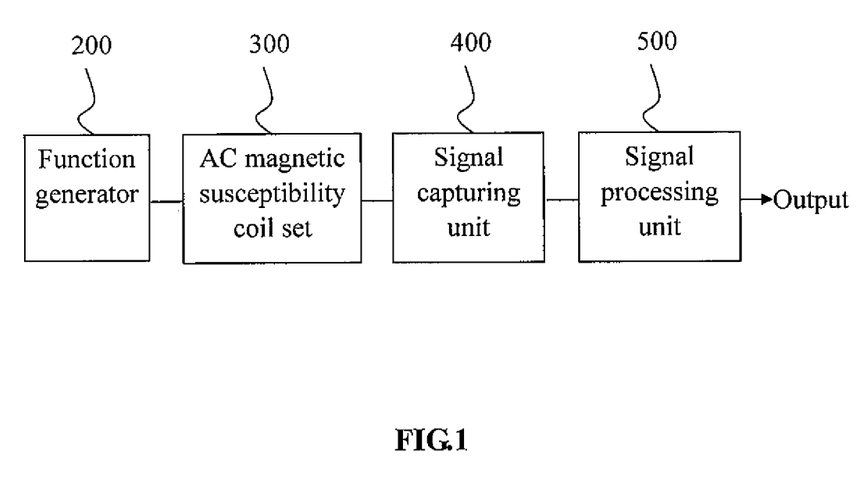
FIG. 1 is a schematic diagram illustrating an embodiment of a device for measuring alternating current magnetic susceptibility of the present invention.

FIG. 1 is a schematic diagram illustrating an embodiment of a device for measuring alternating current magnetic susceptibility of the present invention. Referring to FIG. 1, the device for measuring alternating current magnetic susceptibility provides an AC (alternating current) voltage to an alternating current magnetic susceptibility coil set 300 by a function generator 200 built-in the device for measuring alternating current magnetic susceptibility for the alternating current magnetic susceptibility coil set 300 with an AC current inside and then an alternating current magnetic field inside the alternating current magnetic susceptibility coil set 300 is generated. The alternating current magnetic field of the alternating current magnetic susceptibility coil set 300 is changed for generating an alternating current magnetic susceptibility signal after a under testing particle disposed in the alternating current magnetic susceptibility coil set 300. The alternating current magnetic susceptibility signal of the alternating current magnetic susceptibility coil set 300 is then captured to the signal processing unit 500 through the signal capturing unit 400 and converted to the alternating current magnetic susceptibility intensity and phase difference of the under testing particle by the conversion system, such as fast Fourier transform hardware, fast Fourier transform firmware and fast Fourier transform software, of the signal processing unit 500. Moreover, real part and the imaginary part of the alternating current magnetic susceptibility intensity are able to be indicated by a real part alternating current magnetic susceptibility signal and an imaginary part alternating current magnetic susceptibility signal. Besides, alternating current magnetic susceptibility of the under testing particle is able to be measured in the magnetic field with various frequencies by tuning the alternating current voltage outputted from the function generator 200. A relationship diagram of measuring the alternating current magnetic susceptibility of the under testing particle and frequency of the external added field is, therefore, established. The after-processing signal is outputted to an external display device, such as a computer, a LCD monitor or a television.

Figure 2:
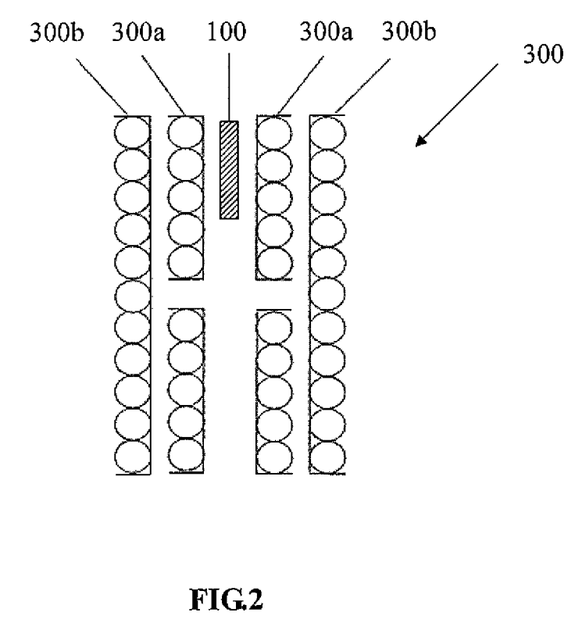
FIG. 2 is a schematic diagram illustrating the corresponding location between the alternating current magnetic coil set and the particle in FIG. 1.

FIG. 2 is a schematic diagram illustrating the corresponding location between the alternating current magnetic coil set and the particle in FIG. 1. The pickup coil 300a of the alternating current magnetic susceptibility coil set 300 is a gradient coil or a Faraday coil formed by a polyoxymethylene (POM) material tube with copper wires surrounded. The surrounding direction of the copper wires is opposite to upper half and lower half of the tube. At first, an under testing particle 100 is disposed in the alternating current magnetic coil set 300, then the pickup coil 300a is used for picking up the alternating current magnetic susceptibility signal of the under testing particle 100. An exciting coil 300b formed by processing polyoxymethylene (POM) material with a copper wires are wrapped around the pickup coil 300a. The exciting coil 300b is coupled to the function generator 200 for generating an alternating current magnetic field. The alternating current magnetic susceptibility signal passes through planar magnetic flux surrounded by the pickup coil 300a and varies periodically with the time. The pickup coil 300a is then generating a periodically alternating current voltage and the amplitude product of the alternating current voltage is direct proportion to alternating current frequency variation and alternating current magnetic signal. Therefore, the alternating current magnetic susceptibility signal of the under testing particle 100 generated in the known alternating current frequency is able to be extracted by the output voltage from the pickup coil 300a.

Figure 3:
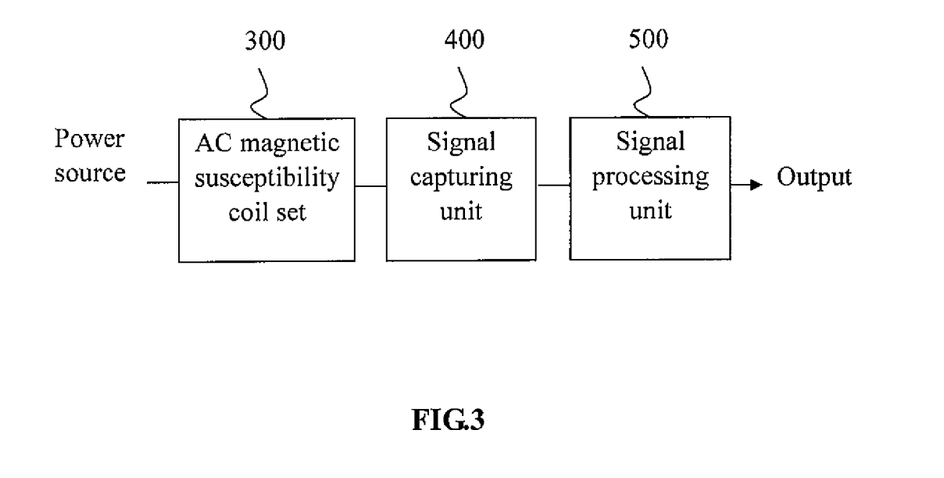
FIG. 3 is a schematic diagram illustrating another embodiment of a device for measuring alternating current magnetic susceptibility according to the present invention.

FIG. 3 is a schematic diagram illustrating another embodiment of a device for measuring alternating current magnetic susceptibility according to the present invention. Referring to FIG. 1, an external power source, such as an alternating current power supply of the function generator 200, provides an AC (alternating current) voltage to the alternating current magnetic susceptibility coil set 300 for the alternating current magnetic susceptibility coil set 300 with an AC current inside and then an alternating current magnetic field inside the alternating current magnetic susceptibility coil set 300 is generated. After disposing the under testing particle 100 in the alternating current magnetic coil set 300, the alternating current magnetic field of the alternating current magnetic susceptibility coil set 300 is changed for generating an alternating current magnetic susceptibility signal after a under testing particle disposed in the alternating current magnetic susceptibility coil set 300. The alternating current magnetic susceptibility signal of the alternating current magnetic susceptibility coil 300 is then captured to the signal processing unit 500 through the signal capturing unit 400 and converted to the alternating current magnetic susceptibility intensity and phase difference of the under testing particle by the conversion system, such as fast Fourier transform hardware, fast Fourier transform firmware and fast Fourier transform software, of the signal processing unit 500. Moreover, real part and the imaginary part of the alternating current magnetic susceptibility intensity are able to be indicated by a real part alternating current magnetic susceptibility signal and an imaginary part alternating current magnetic susceptibility signal. A relationship diagram of measuring the alternating current magnetic susceptibility of the under testing particle and frequency of the external added field is, therefore, established. The after-processing signal is outputted to an external display device, such as a computer, a LCD monitor or a television.

Figure 4:
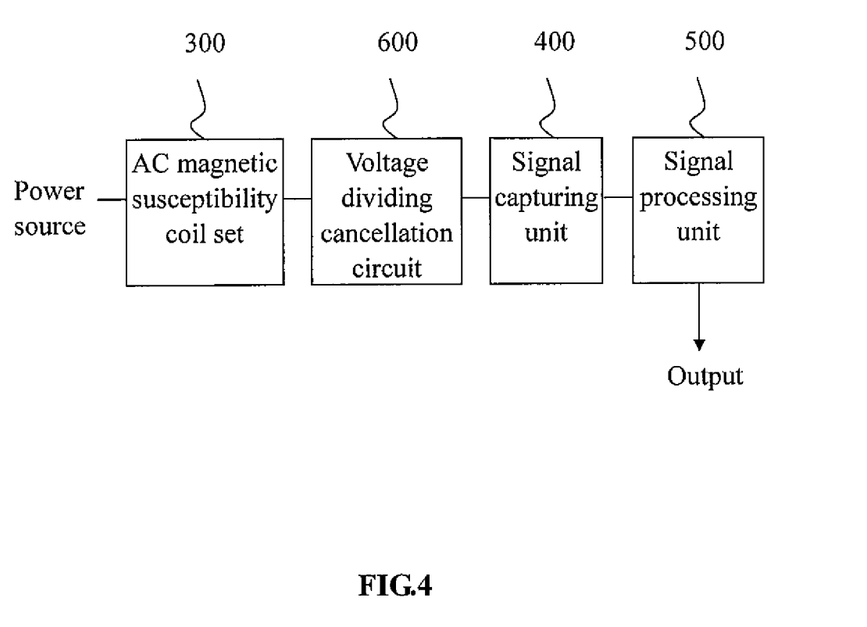
FIG. 4 is a schematic diagram illustrating another yet embodiment of a device for measuring alternating current magnetic susceptibility according to the present invention.

FIG. 4 is a schematic diagram illustrating another yet embodiment of a device for measuring alternating current magnetic susceptibility according to the present. invention. Referring to FIG. 4 with the above embodiment, a power source, such as an alternating current power supply of the function generator 200, provides an AC (alternating current) voltage to the alternating current magnetic susceptibility coil set 300 for the alternating current magnetic susceptibility coil set 300 with an AC current inside and then an alternating current magnetic field inside the alternating current magnetic susceptibility coil set 300 is generated. After disposing the under testing particle 100 in the alternating current magnetic coil set 300, the under testing particle 100 is excited to generate an alternating current magnetic susceptibility signal due to the alternating current magnetic field affection. Therefore, the alternating current magnetic susceptibility signal of the under testing particle 100 generated in the known alternating current frequency is able to be extracted, as the description corresponding to FIG. 3, by the periodically alternating current voltage outputted from the pickup coil 300a of the alternating current magnetic susceptibility coil set 300. The pickup coil 300a of the present invention is further coupled to a voltage dividing cancellation circuit 600 for cancelling the exciting coil 300b output signal affection by the alternating current magnetic field generated from the exciting coil 300b. After the outputted alternating current voltage from the pickup coil 300a passing through the voltage dividing cancellation circuit 600 and being captured to the signal processing unit 500 through the signal capturing unit 400, and the converting system, such as fast Fourier transform hardware, fast Fourier transform firmware and fast Fourier transform software, in the signal processing unit 500 converts the transient voltage signal captured from the signal capturing unit 400 to a spectrum signal and analyzes real part and imaginary part of the alternating current magnetic susceptibility of the under testing particle and/or the alternating current magnetic susceptibility intensity and phase difference under the alternating current frequency generated by the alternating current magnetic susceptibility coil set 300. A relationship diagram of measuring the alternating current magnetic susceptibility of the under testing particle and frequency of the external added field is, therefore, established. The after-processing signal is outputted to an external display device, such as a computer, a LCD monitor or a television.

Figure 5:
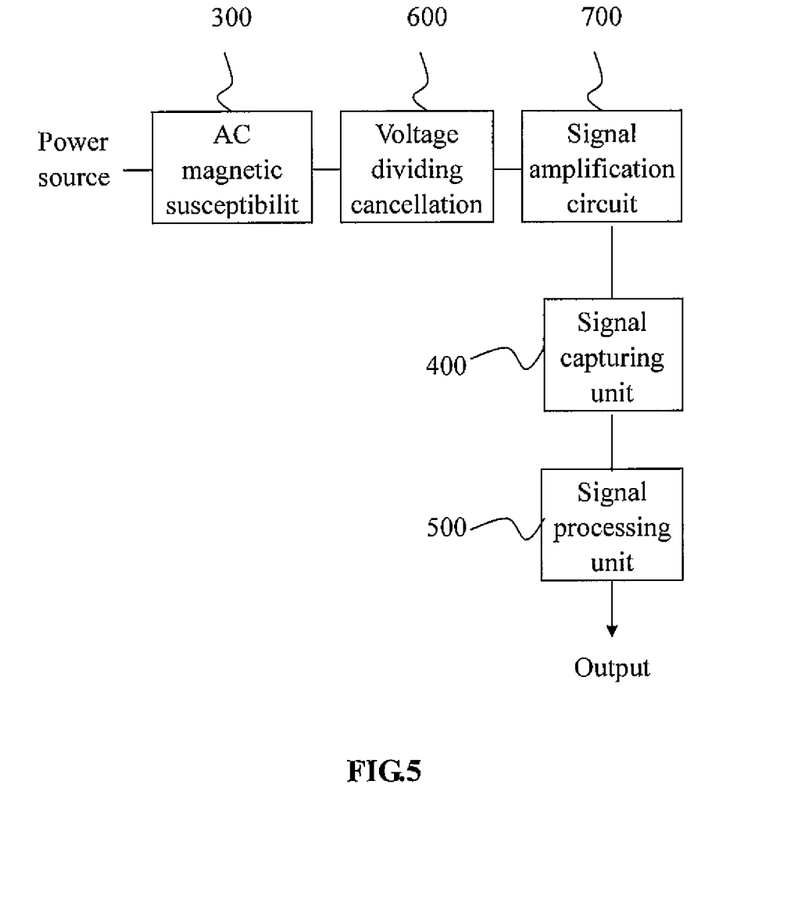
FIG. 5 is a schematic diagram illustrating a further embodiment of a device for measuring alternating current magnetic susceptibility according to the present invention.

FIG. 5 is a schematic diagram illustrating a further embodiment of a device for measuring alternating current magnetic susceptibility according to the present invention. Referring to FIG. 5, a power source, such as an alternating current power supply of the function generator 200, provides an AC (alternating current) voltage to the alternating current magnetic susceptibility coil set 300 for the alternating current magnetic susceptibility coil set 300 with an AC current inside and then an alternating current magnetic field inside the alternating current magnetic susceptibility coil set 300 is generated. After disposing the under testing particle 100 in the alternating current magnetic coil set 300, the under testing particle 100 is excited to generate an alternating current magnetic susceptibility signal due to the alternating current magnetic field affection. As shown in FIG. 4, the pickup coil 300a of the present invention is coupled to a voltage dividing cancellation circuit 600 for cancelling the exciting coil 300b output signal affection by the alternating current magnetic field generated from the exciting coil 300b. After the outputted alternating current voltage from the pickup coil 300a passing through the voltage dividing cancellation circuit 600, the outputted voltage from the voltage dividing cancellation circuit 600 of the embodiment is received by a signal amplification circuit 700 for increasing the SN (signal-noise ratio). The signal amplification circuit 700 is series connected between the alternating current magnetic susceptibility coil set 300 and the signal capturing unit 400. The amplified alternating current voltage is then captured to the signal processing unit 500 through the signal capturing unit 400, and the converting system, such as fast Fourier transform hardware, fast Fourier transform firmware and fast Fourier transform software, in the signal processing unit 500 converts the amplified alternating current voltage captured from the signal capturing unit 400 to a spectrum signal and analyzes real part and imaginary part of the alternating current magnetic susceptibility of the under testing particle and/or the alternating current magnetic susceptibility intensity and phase difference under various alternating current frequencies generated by the alternating current magnetic susceptibility coil set 300. The varying relationship is able to be outputted to an external display device, such as a computer, a LCD monitor or a television.

Figure 6:
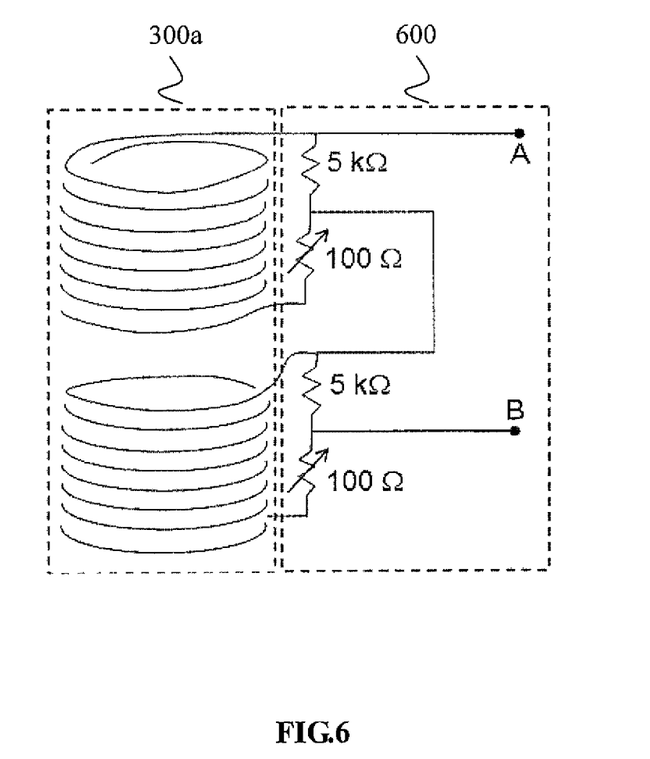
FIG. 6 is a schematic diagram illustrating the pickup coil and the voltage dividing cancellation circuit according to the present invention.

FIG. 6 is a schematic diagram illustrating the pickup coil and the voltage dividing cancellation circuit according to the present invention following FIG. 5. The connection relationship between the voltage dividing cancellation circuit 600 of the device for measuring alternating current magnetic susceptibility and the pickup coil 300a of the alternating current magnetic susceptibility coil set 300 is shown in description of FIG. 3. The pickup coil 300a, which is a gradient Faraday coil and composed of a plurality of coils, is formed by a polyoxymethylene (POM) material tube with copper wires surrounded. The surrounding direction of the copper wires is opposite to upper half and lower half of the tube. The upper half and lower half of the gradient Faraday coils are each coupled to a resistor and a variable resistor set of the voltage dividing cancellation circuit 600, respectively. As FIG. 6 shown, the resistances of the resistors and the variable resistors are 5 kΩ and 100 kΩ, respectively. The resistors and the variable resistors of the voltage dividing cancellation circuit 600 are able to be coupled with different connection types and the resistances of the resistors and the variable resistors of the voltage dividing cancellation circuit 600 are not restricted to 5 kΩ and 100 kΩ, respectively. After disposing the under testing particle 100 in the alternating current magnetic coil set 300, the under testing particle 100 is excited to generate the alternating current magnetic susceptibility signal due to the alternating current magnetic field affection. After the alternating current voltage signal converted from the alternating current magnetic susceptibility signal by the pickup coil 300a passing through the voltage dividing cancellation circuit 600, the dividing voltages of each resistor and the variable resistor set are subtracted from each other for cancelling the exciting coil 300b output signal affection by the alternating current magnetic field generated from the exciting coil 300b. Finally, the voltage dividing cancellation circuit 600 outputs voltages on node A and node B.

Figure 7:
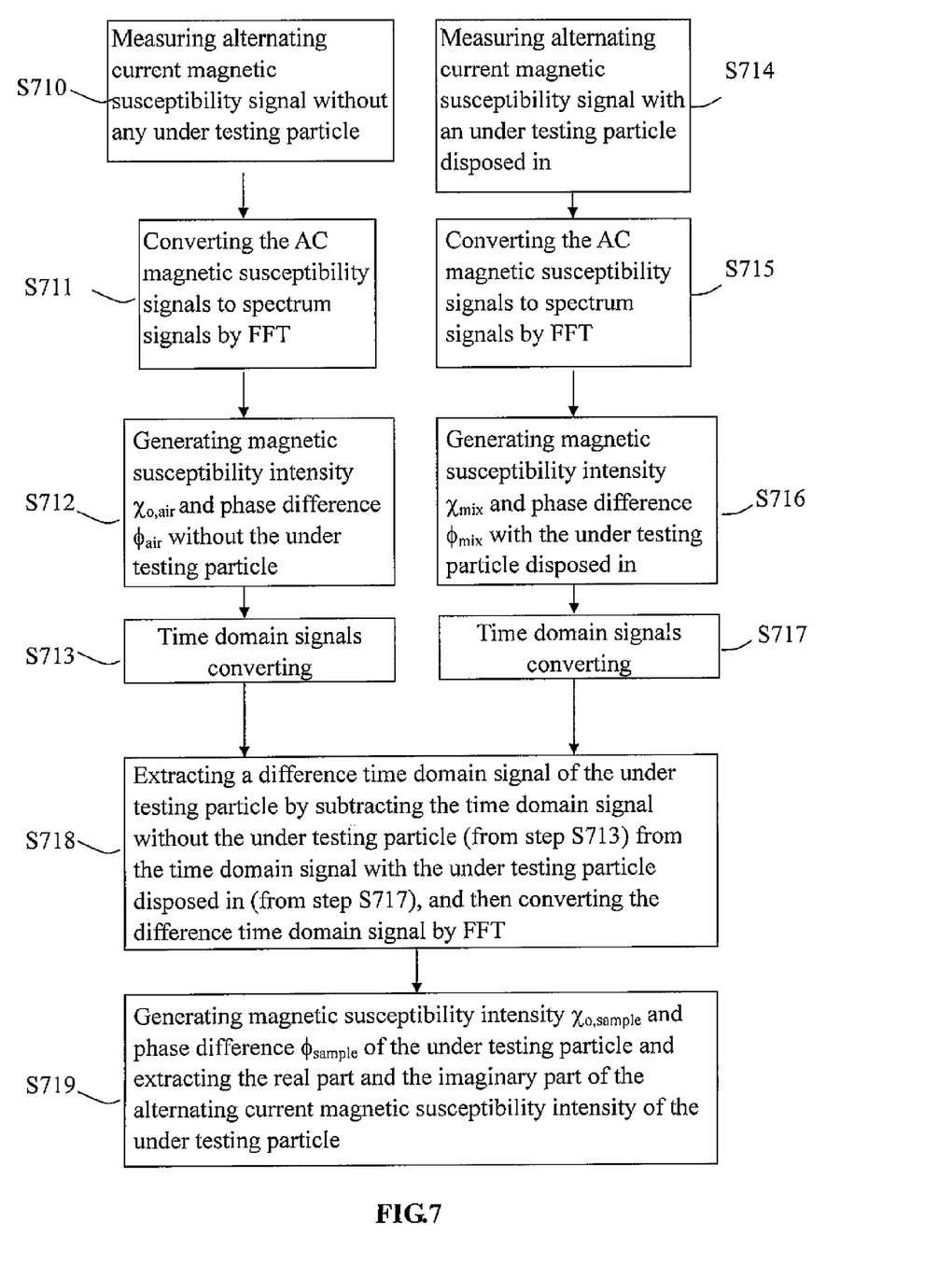
FIG. 7 is a flow chart illustrating an embodiment of a method for measuring alternating current magnetic susceptibility of the present invention.

FIG. 7 is a flow chart illustrating an embodiment of a method for measuring alternating current magnetic susceptibility of the present invention. As shown, at first, step S710 for measuring alternating current magnetic susceptibility signal without any under testing particle 100 and step S714 for measuring alternating current magnetic susceptibility signal with an under testing particle 100 disposed in are simultaneously proceeding for acquiring alternating current magnetic susceptibility signals with and without the under testing particle 100. Steps S711 and S715 are used for converting the alternating current magnetic susceptibility signals to spectrum signals by FFT (fast Fourier transform). Steps S712 and S716 are used for generating magnetic susceptibility intensity $\chi_{o,air}$ and phase difference $\phi_{air}$ without the under testing particle 100 and generating magnetic susceptibility intensity $\chi_{mix}$ and phase difference $\phi_{mix}$ with the under testing particle 100 disposed in, respectively. Steps S713 and S717 are used for converting the magnetic susceptibility intensity $\chi_{o,air}$ and phase difference $\phi_{air}$ without the under testing particle 100 and the magnetic susceptibility intensity $\chi_{mix}$ and phase difference $\phi_{mix}$ with the under testing particle 100 disposed in to time domain signals, respectively. Step S718 is used for extracting a difference time domain signal of the under testing particle 100 by subtracting the time domain signal without the under testing particle 100 (from step S713) from the time domain signal with the under testing particle 100 disposed in (from step S717), and then converting the difference time domain signal by FFT (fast Fourier transform). Finally, the magnetic susceptibility intensity $\chi_{o,sample}$ and phase difference $\phi_{sample}$ of the under testing particle 100 are generated in step S719, and the real part and the imaginary part of the alternating current magnetic susceptibility intensity of the under testing particle are extracted according to the measured magnetic susceptibility amplitude and the phase of corresponding external added field.

Figure 8:
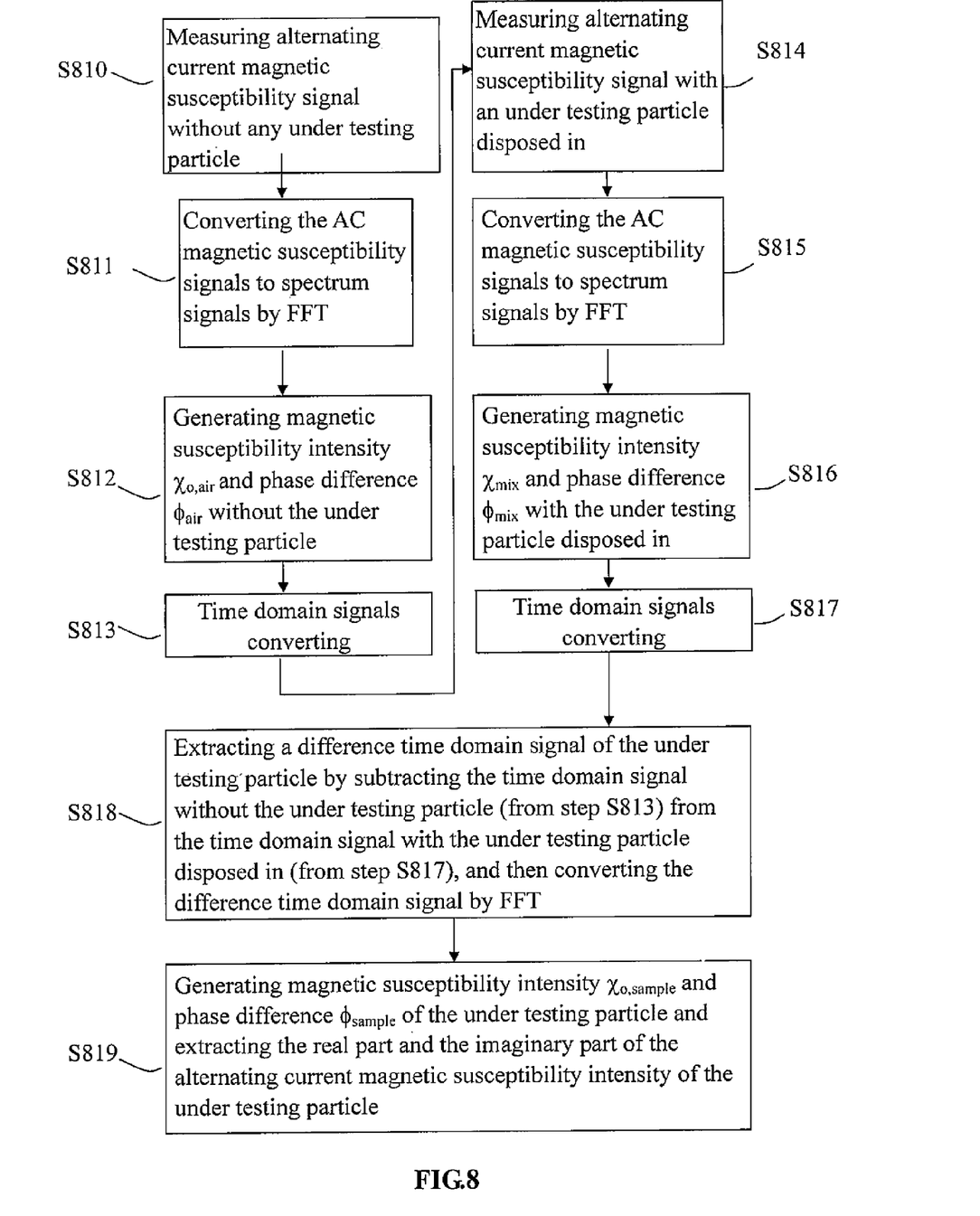
FIG. 8 is a flow chart illustrating another embodiment of a method for measuring alternating current magnetic susceptibility of the present invention.

FIG. 8 is a flow chart illustrating another embodiment of a method for measuring alternating current magnetic susceptibility of the present invention. As shown, at first, step S810 is used for measuring alternating current magnetic susceptibility signal without any under testing particle 100 and then step S811 is used for converting the alternating current magnetic susceptibility signal without any under testing particle 100 to a spectrum signal by FFT (fast Fourier transform). Step S812 is used for generating magnetic susceptibility intensity and phase difference $\phi_{air}$, and then a time-spectrum domain conversion step, S813, is used for converting the spectrum signal without any under testing particle 100 to a time domain signal.

After the above steps for measuring alternating current magnetic susceptibility signal without any under testing particle 100 are accomplished, step S814 is used for measuring alternating current magnetic susceptibility signal with the under testing particle 100 disposed in and then step S815 is used for converting the alternating current magnetic susceptibility signal with the under testing particle 100 disposed in to a spectrum signal by FFT (fast Fourier transform). Step S816 is used for generating magnetic susceptibility intensity $\chi_{o,mix}$ and phase difference $\phi_{mix}$, and then a time-spectrum domain conversion step, S817, is used for converting the spectrum signal with the under testing particle 100 disposed in to a time domain signal.

Next, Step S818 is used for extracting a difference time domain signal of the under testing particle 100 by subtracting the time domain signal without the under testing particle 100 (from step S813) from the time domain signal with the under testing particle 100 disposed in (from step S817), and then converting the difference time domain signal by FFT (fast Fourier transform). Finally, the magnetic susceptibility intensity $\chi_{o,sample}$ and phase difference $\phi_{sample}$ sample of the under testing particle 100 are generated in step S819, and the real part and the imaginary part of the alternating current magnetic susceptibility intensity of the under testing particle are extracted according to the measured magnetic susceptibility amplitude and the phase of corresponding external added field.

FIG. 9 is a flow chart illustrating another yet embodiment of a method for measuring alternating current magnetic susceptibility of the present invention. As shown, at first, step S914 is used for measuring alternating current magnetic susceptibility signal with under testing particle 100 disposed in and then step S915 is used for converting the alternating current magnetic susceptibility signal with under testing particle 100 disposed in to a spectrum signal by FFT (fast Fourier transform). Step S916 is used for generating magnetic susceptibility intensity $\chi_{o,air}$ and phase difference $\phi_{air}$, and then a time-spectrum domain conversion step, S917, is used for converting the spectrum signal with under testing particle 100 disposed in to a time domain signal.

After the above steps for measuring alternating current magnetic susceptibility signal with under testing particle 100 dispose in are accomplished, the under testing particle 100 is then removed. Next, step S910 is used for measuring alternating current magnetic susceptibility signal without the under testing particle 100 and then step S911 is used for converting the alternating current magnetic susceptibility signal without the under testing particle 100 to a spectrum signal by FFT (fast Fourier transform). Step 912 is used for generating magnetic susceptibility intensity $\chi_{o,mix}$ and phase difference $\phi_{mix}$, and then a time-spectrum domain conversion step, S913, is used for converting the spectrum signal with the under testing particle 100 disposed in to a time domain signal.

Next, step S918 is used for extracting a difference time domain signal of the under testing particle 100 by subtracting the time domain signal without the under testing particle 100 (from step S913) from the time domain signal with the under testing particle 100 disposed in (from step S917), and then converting the difference time domain signal by FFT (fast Fourier transform). Finally, the magnetic susceptibility intensity $\chi_{o,sample}$ and phase difference $\phi_{sample}$ of the under testing particle 100 are generated in step S919, and the real part and the imaginary part of the alternating current magnetic susceptibility intensity of the under testing particle are extracted according to the measured magnetic susceptibility amplitude and the phase of corresponding external added field.

According to the device and method for measuring alternating current magnetic susceptibility of the present invention, the state and sort of the under testing particle are not restricted to the magnetic fluids aforementioned. Magnetic particles or non-magnetic particles in solid state, liquid state or gaseous state are well suited to the under testing particle for measuring the alternating current magnetic susceptibility in the present invention.

Figure 11:
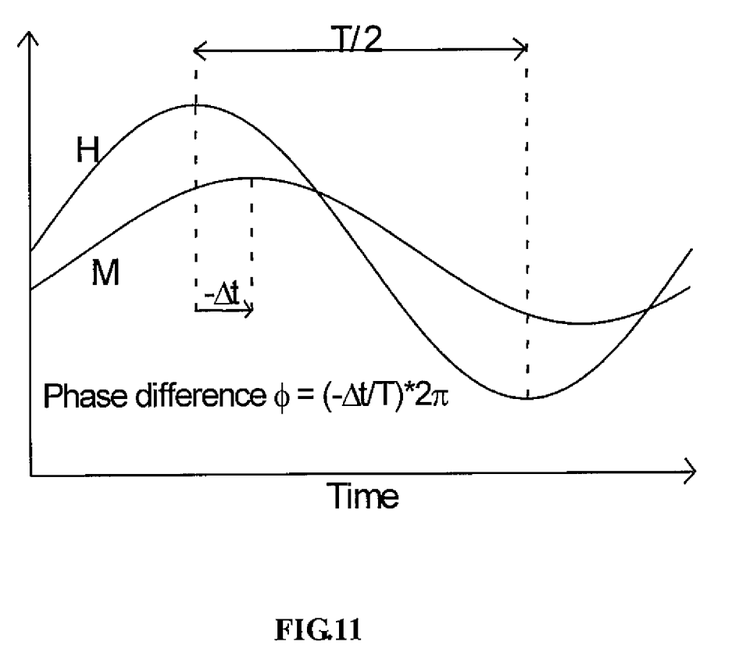
FIG. 11 is a relationship diagram of measuring the phase differences between the magnetic dipole moment of the magnetic fluids and the external added field according to one embodiment of the present invention.

The present invention measures the variation of magnetic fluids with different concentration following frequency variation of an external added field. The magnetic fluids are kerosene base having concentrations of 6.0 emu/g, 3.6 emu/g, 2.0 emu/g and 1.2 emu/g, respectively. FIG. 10 is a relationship diagram of measuring the alternating current magnetic susceptibility intensity and phase difference of magnetic fluids with different concentration following frequency variation of an external added field according to one embodiment of the present invention. The present invention measures the alternating current magnetic susceptibility intensity and phase difference of magnetic fluids with these four concentrations following frequency variation of an external added field. In the upper diagram of FIG. 10, the alternating current magnetic susceptibility intensity ($\chi_o$) variation of magnetic fluids with these four concentrations following frequency variation of an external added field is shown; in the lower diagram of FIG. 10, the phase differences ($\theta$) between the magnetic dipole moment of the magnetic fluids and the external added field following frequency variation of the external added field is shown. FIG. 11 is a relationship diagram of measuring the phase differences between the magnetic dipole moment of the magnetic fluids and the external added field according to one embodiment of the present invention. As shown, the phase differences ($\theta$) are all negative. This means that the directions of the magnetic dipole moment of the magnetic fluids are quite different and falling behind to the external added field's.

Figure 12:
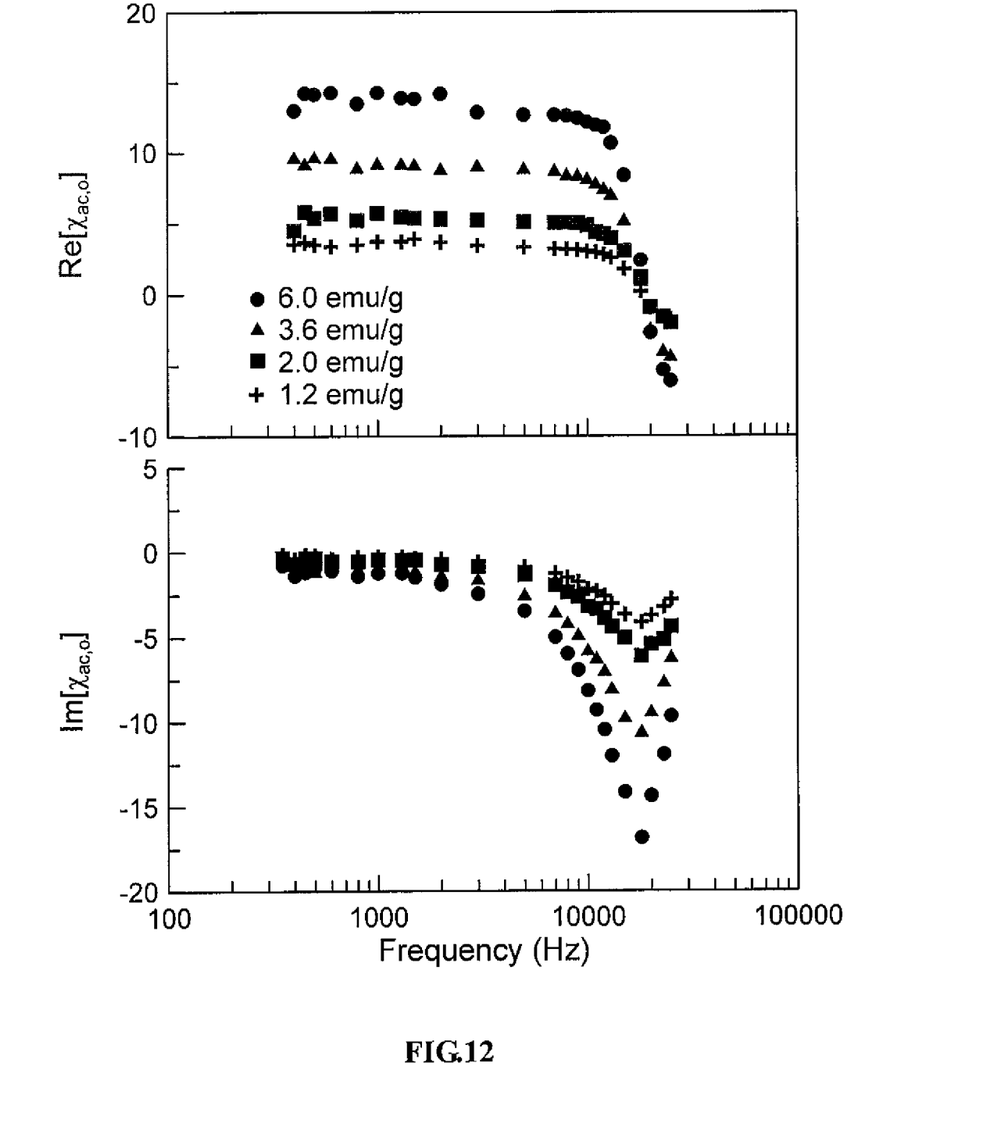
FIG. 12 is a relationship diagram of measuring the real part and the imaginary part of the alternating current magnetic susceptibility of the magnetic fluids following frequency variation of the external added field according to one embodiment of the present invention.

Besides, according to the embodiment of measuring the fluids, the relationship of the real part and the imaginary part of the alternating current magnetic susceptibility of the magnetic fluids following frequency variation of the external added field is measured. Referring to FIG. 12, a discrimination relationship diagram of the real part ($\text{Re}[\chi_{ac,o}]$) and the imaginary part ($\text{Im}[\chi_{ac,o}]$) of the alternating current magnetic susceptibility of the magnetic fluids with these four concentrations following frequency variation of the external added field is shown.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A device for measuring alternating current magnetic susceptibility, comprising:
    an alternating current magnetic susceptibility coil set, including:
        an exciting coil coupled to an external function generator for generating an alternating current magnetic field based on variation of alternating current electrical signals form the function generator; and
        a pickup coil for picking up an alternating current magnetic susceptibility signal of an under testing particle generated by inducting the variation of the alternating current magnetic field of the exciting coil; and
        a voltage dividing cancellation circuit coupled to the pickup coil of the alternating current magnetic susceptibility coil set;
    a signal capturing unit for capturing the alternating current magnetic susceptibility signal picked up by the pickup coil; and
    a signal processing unit for processing the alternating current magnetic susceptibility signal from the signal capturing unit and extracting the alternating current magnetic susceptibility intensity variation and phase difference and/or the real part and the imaginary part of the alternating current magnetic susceptibility.

2. The device for measuring alternating current magnetic susceptibility according to claim 1, wherein the alternating current magnetic susceptibility coil set further comprises an input port for coupling to the external function generator.

3. The device for measuring alternating current magnetic susceptibility according to claim 1, wherein the signal processing unit further comprises a fast Fourier transform hardware, a fast Fourier transform firmware and fast Fourier transform software for converting the alternating current magnetic susceptibility signal from the signal capturing unit.

4. The device for measuring alternating current magnetic susceptibility according to claim 1, wherein the exciting coil is a solenoid coil or a Helmholtz coil.

5. The device for measuring alternating current magnetic susceptibility according to claim 1, wherein the pickup coil is a gradient coil or a Faraday coil.

6. The device for measuring alternating current magnetic susceptibility according to claim 1, further comprising a signal amplification circuit series connected between the alternating current magnetic susceptibility coil set and the signal capturing unit.

7. A device for measuring alternating current magnetic susceptibility, comprising:
    a function generator for generating alternating current electrical signals;
    an alternating current magnetic susceptibility coil set, including:
        an exciting coil coupled to the function generator for generating an alternating current magnetic field based on variation of the alternating current electrical signals form the function generator; and
        a pickup coil for picking up an alternating current magnetic susceptibility signal of an under testing particle generated by inducting the variation of the alternating current magnetic field of the exciting coil; and
        a voltage dividing cancellation circuit coupled to the pickup coil of the alternating current magnetic susceptibility coil set;
    a signal capturing unit for capturing the alternating current magnetic susceptibility signal picked up by the pickup coil; and
    a signal processing unit for processing the alternating current magnetic susceptibility signal from the signal capturing unit and extracting the alternating current magnetic susceptibility intensity variation and phase difference and/or the real part and the imaginary part of the AC magnetic susceptibility.

8. The device for measuring alternating current magnetic susceptibility according to claim 7, wherein the signal processing unit further comprises a fast Fourier transform hardware, a fast Fourier transform firmware and fast Fourier transform software for converting the alternating current magnetic susceptibility signal from the signal capturing unit.

9. The device for measuring alternating current magnetic susceptibility according to claim 7, wherein the exciting coil is a solenoid coil or a Helmholtz coil.

10. The device for measuring alternating current magnetic susceptibility according to claim 7, wherein the pickup coil is a gradient coil or a Faraday coil.

11. The device for measuring alternating current magnetic susceptibility according to claim 7, further comprising a signal amplification circuit series connected between the alternating current magnetic susceptibility coil set and the signal capturing unit.

* * * * *